(12) United States Patent
Shin et al.

(10) Patent No.: US 7,826,277 B2
(45) Date of Patent: Nov. 2, 2010

(54) NON-VOLATILE MEMORY DEVICE AND METHOD OF OPERATING THE SAME

(75) Inventors: Tae Ho Shin, Icheon-si (KR); Joong Seob Yang, Seongnam-si (KR); Jun Seop Chung, Yongin-si (KR); You Sung Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 161 days.

(21) Appl. No.: 12/138,503

(22) Filed: Jun. 13, 2008

(65) Prior Publication Data
US 2009/0225596 A1     Sep. 10, 2009

(30) Foreign Application Priority Data
Mar. 10, 2008   (KR) ...................... 10-2008-0021942

(51) Int. Cl.
*G11C 7/10*         (2006.01)
(52) U.S. Cl. ........................... 365/189.05; 365/185.22; 365/185.05
(58) Field of Classification Search ............ 365/189.05, 365/185.22, 195.05, 185.18, 230.06, 189.17, 365/185.23, 185.21
See application file for complete search history.

(56) References Cited

U.S. PATENT DOCUMENTS

| 7,038,946 | B2* | 5/2006 | Hosono et al. | 365/185.17 |
| 2007/0211537 | A1* | 9/2007 | Park et al. | 365/185.22 |
| 2009/0040826 | A1* | 2/2009 | Cha et al. | 365/185.09 |

* cited by examiner

*Primary Examiner*—Dang T Nguyen
(74) *Attorney, Agent, or Firm*—Townsend and Townsend and Crew LLP

(57) ABSTRACT

A non-volatile memory device is disclosed. The non-volatile memory device includes an encoder configured to set random data in a unit of a word line, and generate second data to be programmed in a memory cell by performing logic operation about the random data and first data inputted for program, and a data converting circuit configured to have a decoder for generating the first data by performing logic operation about the second data read from the memory cell and the random data.

19 Claims, 4 Drawing Sheets

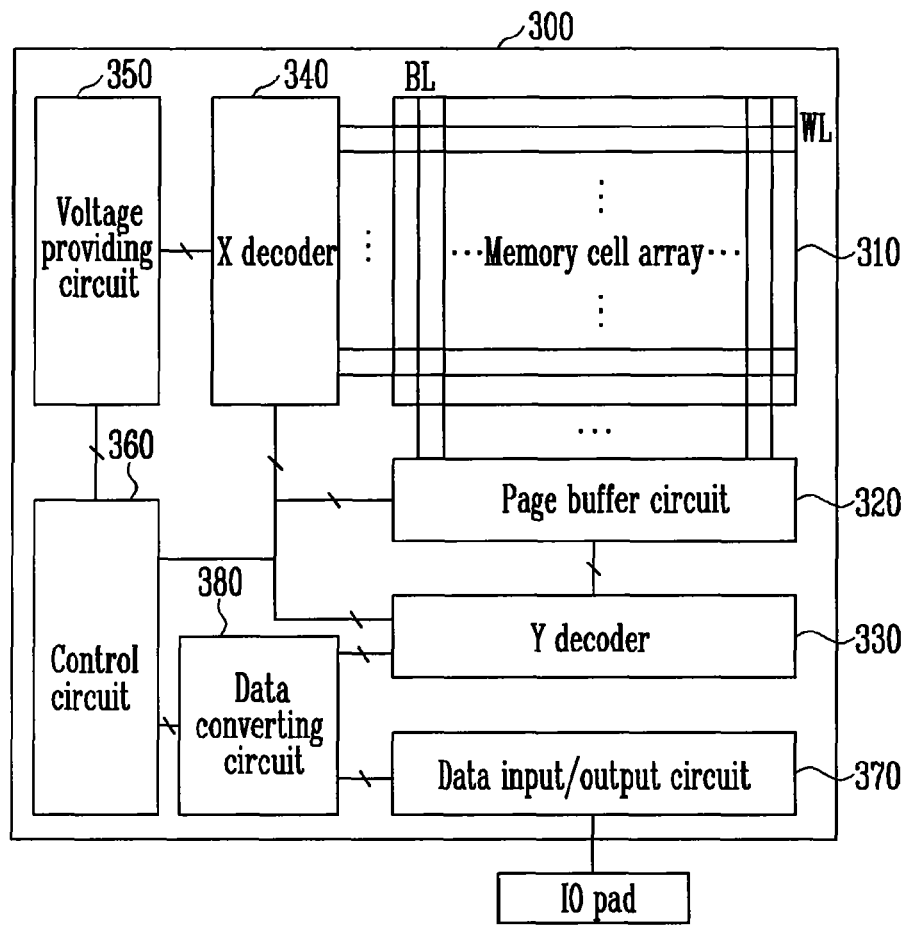
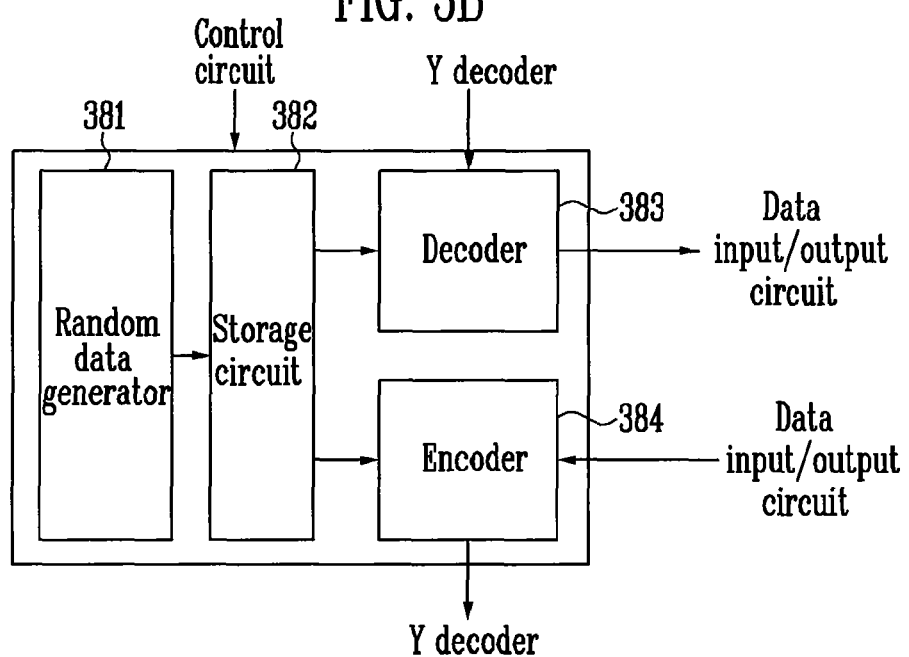

NON-VOLATILE MEMORY DEVICE AND METHOD OF OPERATING THE SAME

CROSS-REFERENCE TO RELATED APPLICATIONS

This application claims priority from Korean Patent Application No. 10-2008-0021942, filed on Mar. 10, 2008, the contents of which are incorporated herein by reference in its entirety.

BACKGROUND OF THE INVENTION

The present invention relates to a non-volatile memory device. More particularly, the present invention relates to a non-volatile memory device for programming and reading data which reduces errors.

Generally, a flash memory device is divided into a NAND flash memory and a NOR flash memory. In the NOR flash memory, each of the memory cells is connected independently to a bit line and a word line, and so the NOR flash memory has excellent random access time. Whereas, in the NAND flash memory, only one contact is required for one cell string because memory cells are connected in series, and so the NAND flash memory has excellent characteristics for integration. Accordingly, the NAND flash memory has been generally employed in high density flash memory.

Recently, multi bit cells for storing a plurality of data bits in one memory cell has been actively studied so as to enhance the degree of integration of the above flash memory. This memory cell is referred to as a multi level cell (hereinafter, referred to as "MLC"). A memory cell for storing one data bit is referred to as a single level cell (SLC).

The MLC has a plurality of threshold voltage distributions so as to store a plurality of data bits. This means that the data is stored in accordance with each of the cell distribution voltages.

FIG. 1 is a view illustrating a memory cell array in a flash memory device.

In FIG. 1, the memory cell array 110 having memory cells includes a plurality of cell strings.

Each of the cell strings is connected to a corresponding bit line BL. In addition, in each of the cell strings, memory cells C are connected in series between a drain select transistor DST and a source select transistor SST.

Gates of the memory cells are connected to word lines WL.

The memory cell array 110 in FIG. 1 includes a first word line WL<0> to a thirty-second word line WL<31>.

A pair of bit lines is connected to a corresponding page buffer 120. The page buffer 120 may be connected to a different number of bit lines in other implementations.

In the case of programming the thirtieth word line WL<29> of the memory cell array 110, a program voltage is applied to the thirtieth word line WL<29>, and a pass voltage Vpass is provided to the other word lines. Here, since one memory cell stores a plurality of bits in the case that the memory cells C are the MLCs, a threshold voltage of a programmed memory cell in a read operation may be changed based on whether or not memory cells in peripheral cell strings (or adjacent cell strings) of the programmed memory cell are programmed back pattern dependency (BPD).

To reduce the BPD, the word lines WL<0> to WL<31> are programmed sequentially from the first word line WL<0>.

FIG. 2 illustrates a threshold voltage distribution of the memory cells due to BPD. As shown, over-programmed OP memory cells or under-programmed UP memory cells are generated due to the effects of the nearby programmed memory cells, and so the threshold voltage distribution of the memory cells may be widened. In this case, the margin between the threshold voltages of the MLC would be narrowed.

If the pass voltage applied to non-selected word lines is increased too much to reduce the BPD, a disturbance phenomenon of programming unintended memory cells may result.

SUMMARY OF THE INVENTION

The present invention relates to a non-volatile memory device for randomizing data to be programmed in memory cells and storing the randomized data and a method of operating the same.

A non-volatile memory device according to one example embodiment of the present invention includes an encoder configured to set random data in a unit of a word line, and generate second data to be programmed in a memory cell by performing logic operation about the random data and first data inputted for program; and a data converting circuit configured to have a decoder for generating the first data by performing logic operation about the second data read from the memory cell and the random data.

The set random data is '1' or '0' set randomly in a unit of the word line.

The data converting circuit further includes a storage circuit for storing the set random data in accordance with an address of each of the word lines.

The data converting circuit further includes a random data generator for generating randomly '1' or '0' as the set random data.

The encoder performs XOR operation about the first data and the set random data, and the decoder performs the XOR operation about the second data and the set random data.

A non-volatile memory device according to another example embodiment of the present invention includes a memory cell array in which memory cells are coupled to word lines and bit lines; a page buffer circuit configured to have page buffers for programming data in the memory cells or reading data stored in the memory cells; a data converting circuit configured to encode input data inputted for program to data to be programmed by using set data, or decode data read from a specific memory cell to data inputted for program corresponding to the read data; an Y decoder configured to couple the data converting circuit to the page buffer circuit in accordance with an inputted address information; and a control circuit configured to control the data converting circuit so that the data converting circuit selects the set data for the encoding or the decoding in accordance with the address information.

The data converting circuit includes an encoder configured to encode first data inputted for program to second data to be programmed in a memory cell by performing logic operation about the set data set in a unit of the word line and first data; and a decoder configured to decode the second data read from the memory cell to the first data by performing logic operation about the second data and the set data.

The set data is a first logic level data or a second logic data set randomly in a unit of the word line.

The data converting circuit further includes a storage circuit for storing the set data in accordance with an address of each of the word lines.

The data converting circuit further includes a random data generator for generating randomly a first logic level data or a second logic level data for the set data.

The encoder performs XOR operation about the first data and the set data, and the decoder performs the XOR operation about the second data and the set data.

A non-volatile memory device according to still another example embodiment of the present invention includes a memory cell array in which memory cells are coupled to word lines and bit lines; a page buffer circuit configured to have page buffer for programming data in the memory cells or reading data from the memory cells; and an Y decoder configured to output encoded data and decoded data, wherein the encoded data to be programmed are generated by encoding input data inputted for program using set data, and the decoded data are generated by decoding data read from a specific memory cell and are data inputted for program corresponding to the read data.

A non-volatile memory device according to still another example embodiment of the present invention includes a memory cell array in which memory cells are coupled to word lines and bit lines; a page buffer circuit configured to have page buffers for programming data in the memory cells or reading data from the memory cells; an Y decoder configured to provide input/output path of data in the page buffer circuit in accordance with an inputted address information; and a data input/output circuit coupled to the Y decoder, and configured to output encoded data and decoded data, wherein the encoded data to be programmed are generated by encoding input data inputted for program using set data, and the decoded data are generated by decoding data read from a specific memory cell and are data inputted for program corresponding to the read data.

A method of operating a non-volatile memory device according to one example embodiment of the present invention includes generating randomly a first logic level data or a second logic level data, and storing the generated data as set data corresponding to each of word lines; generating second data by performing logic operation about first data inputted for program and the set data set to a word line selected for the program; and programming the second data in memory cells of the selected word line.

The second data are generated by performing XOR operation about the set data and the first data.

The set data is set newly according as the memory cells are erased.

The method further includes reading the second data from the memory cell; and generating the first data by performing logic operation about the read second data and the set data.

The first data are generated by performing XOR operation about the second data and the set data.

A method of operating a non-volatile memory device according to another example embodiment of the present invention includes generating randomly a first logic level data or a second logic level data, and storing the generated data as a set data corresponding to each of word lines; generating second data by performing logic operation about first data inputted for program and the set data set to a word line selected for the program and programming the generated second data; and reading the second data in accordance with a read command, generating the first data by performing logic operation about the read second data and the set data, and outputting the generated first data.

As described above, a non-volatile memory device and a method of operating the same of the present invention control similarly rate of programmed memory cell and memory cells not programmed by using random data, thereby minimizing affection due to peripheral programmed memory cells.

BRIEF DESCRIPTION OF THE DRAWINGS

FIG. 3A is a block diagram illustrating a flash memory device;

FIG. 3B is a block diagram illustrating the data converting circuit in FIG. 3A;

DESCRIPTION OF SPECIFIC EMBODIMENTS

Figure 1:
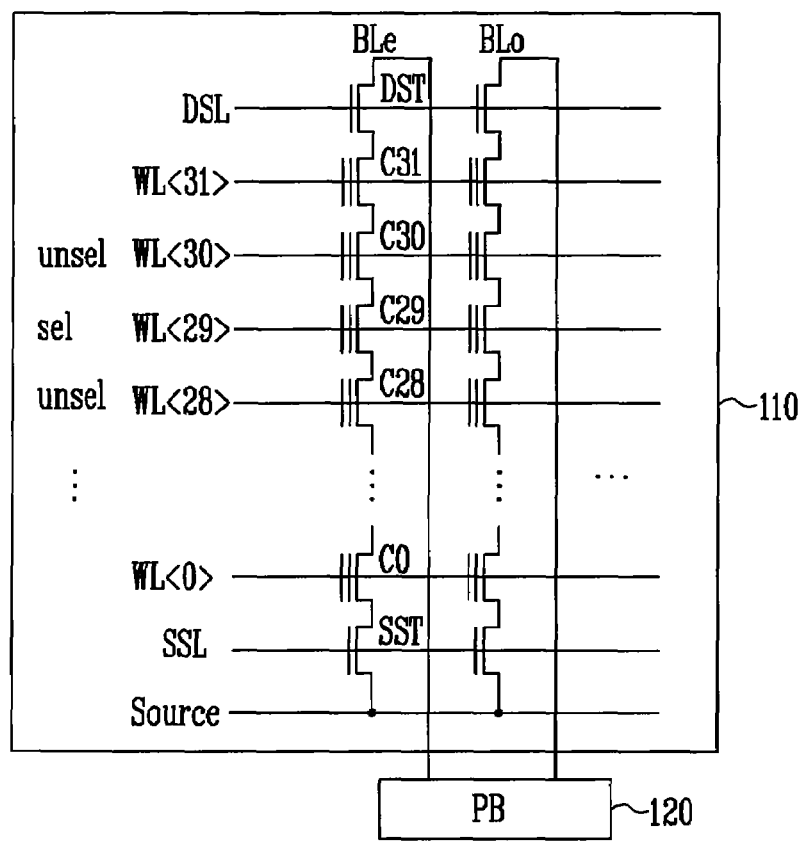
FIG. 1 is a view illustrating a memory cell array in a flash memory device.
Figure 2:
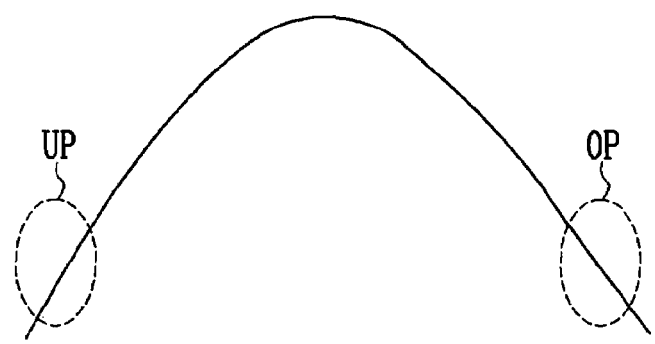
FIG. 2 is a view illustrating threshold voltage distribution of the memory cell due to the BPD.

Hereinafter, the embodiments of the present invention will be explained in more detail with reference to the accompanying drawings.

FIG. 3A is a block diagram illustrating a flash memory device. The flash memory device 300 includes a memory cell array 310, a page buffer circuit 320, an Y decoder 330, an X decoder 340, a voltage providing circuit 350, a control circuit 360, a data input/output circuit 370 and a data converting circuit 380.

The memory cell array 310 has a plurality of cell strings, where each cell string has a plurality of memory cells in series. Here, Each cell string is coupled to a corresponding bit line BL. In addition, the gates of the memory cells are coupled to word lines WL.

The page buffer circuit 320 has a plurality of page buffers. Each page buffer is coupled to a certain number (e.g., two) of the bit lines BL of the memory cell array 310.

The page buffers temporarily store data to be programmed in a selected memory cell and provides the stored data to the memory cell through corresponding bit line BL, or reads data stored in the memory cell and temporarily stores the read data.

The page buffer may include a plurality of latch circuits. Data to be cached/programmed may be inputted to one latch circuit while a program operation is performed by using another latch circuit.

The Y decoder 330 provides input/output path to the page buffer of the page buffer circuit 320 in accordance with an input address. The X decoder selects the word line of the memory cell array 310 in accordance with the input address. The voltage providing circuit 350 generates an operation voltage to be provided to the word line coupled by the X decoder 340 in accordance with control of the control circuit 360.

The control circuit 360 outputs a control signal in accordance with an operation command, and controls the voltage providing circuit 350 so that the voltage providing circuit 350 provides a preset pass voltage to corresponding word lines in accordance with a data program step of the memory cell array 310.

The data input/output circuit 370 transmits data to be programmed inputted through an IO pad (or I/O pad) to the data converting circuit 380, or provides data decoded by the data converting circuit 380 to the IO pad.

The data converting circuit 380 performs an encoding process using the data to be programmed transmitted from the data input/output circuit 370 and data generated randomly, and provides encoded data to the page buffer circuit 320 through the Y decoder 330 so that the encoded data are programmed.

In addition, the data converting circuit 380 decodes data read by the page buffer circuit 320 in a read operation so that the read data are converted back into the original data, and then outputs the decoded data to the data input/output circuit 370.

FIG. 3B is a block diagram illustrating the data converting circuit in FIG. 3A. The data converting circuit 380 includes a data generator 381 (or random data generator), a storage circuit 382, an encoder 383 and a decoder 384.

The random data generator 381 generates random data (or conversion information) corresponding to each of the word lines WL of the memory cell array 310 in an initialization of the flash memory device 300. In another embodiment, the data generated is not random, i.e., a predetermined rule is used.

The storage circuit 382 stores the generated random data (or the conversion information). Here, the random data stored in the storage circuit 382 are divided in accordance with an address of memory block, and one bit ("1" or "0") of information is assigned to a word line of each of the memory blocks in the present embodiment. Accordingly, if a memory block in the memory cell array 310 has 32 word lines, the random data of 32 bits are assigned to that memory block. In other embodiments, more than one bit may be used for the random data (or conversion information).

The random data generator 381 may be embodied by using a pseudo random number generator, etc.

The encoder 384 receives input data from the data input/output circuit 370, and loads random data corresponding to a word line to be programmed from the storage circuit 382 according to the control signal received from the control circuit 360. Here, data to be programmed in a corresponding memory cell are generated by using the input data and the loaded random data. The loaded random data is one bit of data (or information) assigned to the word line to be programmed, e.g., during the initialization of the flash memory device 300.

The data to be programmed are generated by performing an XOR operation on each bit of the input data and the random data. The data generated from the XOR operation is inputted to the page buffer circuit 320 through the Y decoder 330.

The decoder 383 generates data to be outputted by decoding the stored data. Particularly, the decoder 383 receives read data stored in the page buffer circuit 320 in accordance with a read operation. The decode loads (or receives) the random data from the storage circuit 382, where the random data is that assigned to the word line related to the read operation. Then, the decoder 383 generates the "real" data (or output data) to be outputted by performing an XOR operation on the loaded random data and the read data. The XOR operation is performed on each bit of the read data and the random data.

Figure 3C:
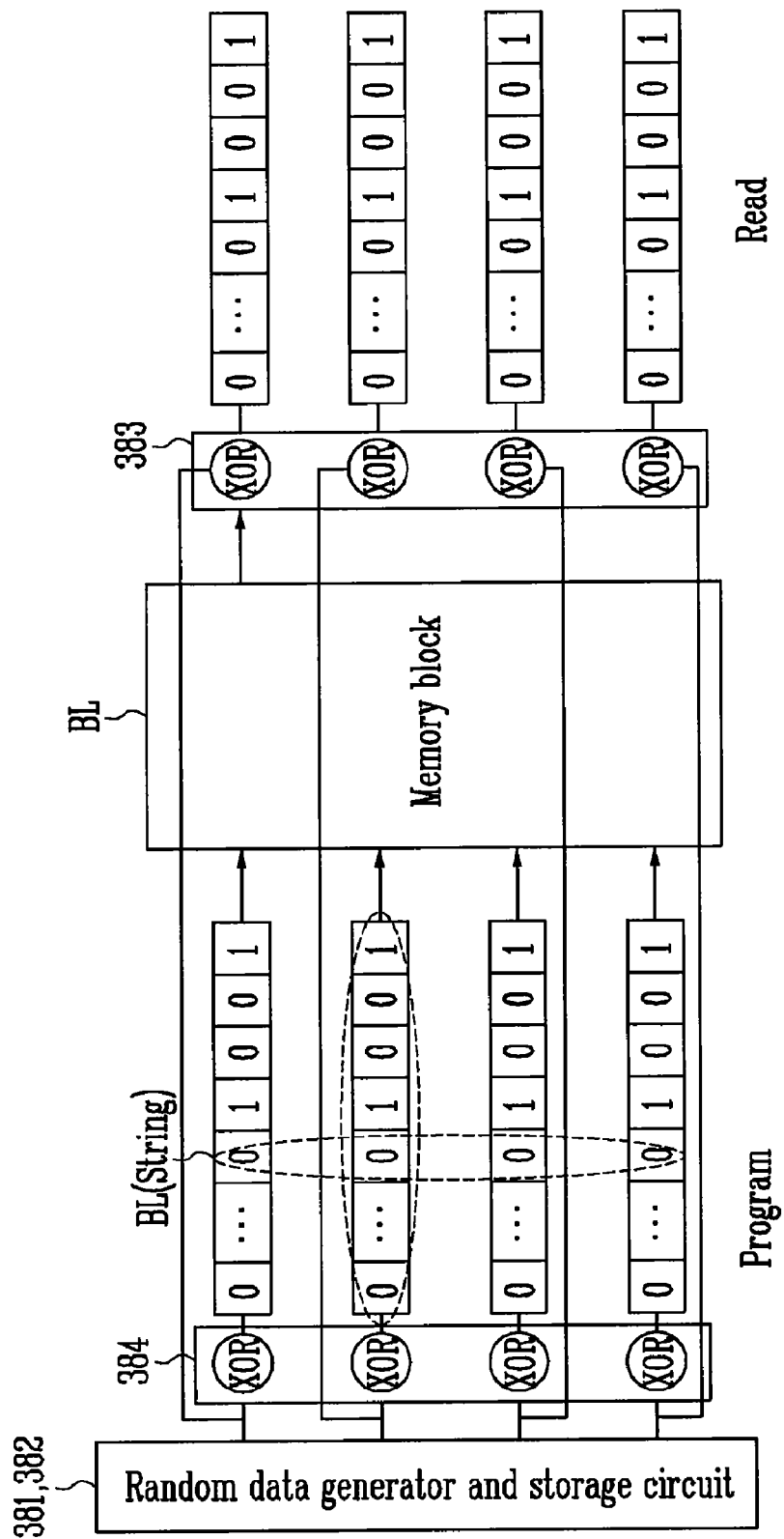
FIG. 3C is a view illustrating a process of encoding and decoding the random data in FIG. 3B.

FIG. 3C is a view illustrating a process of encoding and decoding the random data in FIG. 3B, showing elements related to one memory block BL. The random data generator 381 and the storage circuit 382 are illustrated as one block.

In FIG. 3C, the random data assigned to each word line (or page) in the memory block BL and the input data are XOR-operated, and the data generated by the XOR operation are programmed into the memory cell. Additionally, data outputted from the memory block BL and the corresponding random data are XOR-operated, and then the data generated by the XOR operation are outputted.

In the present embodiment, the random data generated by the random data generator 381 are managed (or stored) in a unit of the memory block. That is, the random data for the word lines in a memory block are stored in the storage circuit 382. The stored random data are deleted if the corresponding memory block is erased. Then, new random data may be generated and stored.

Figure 4:
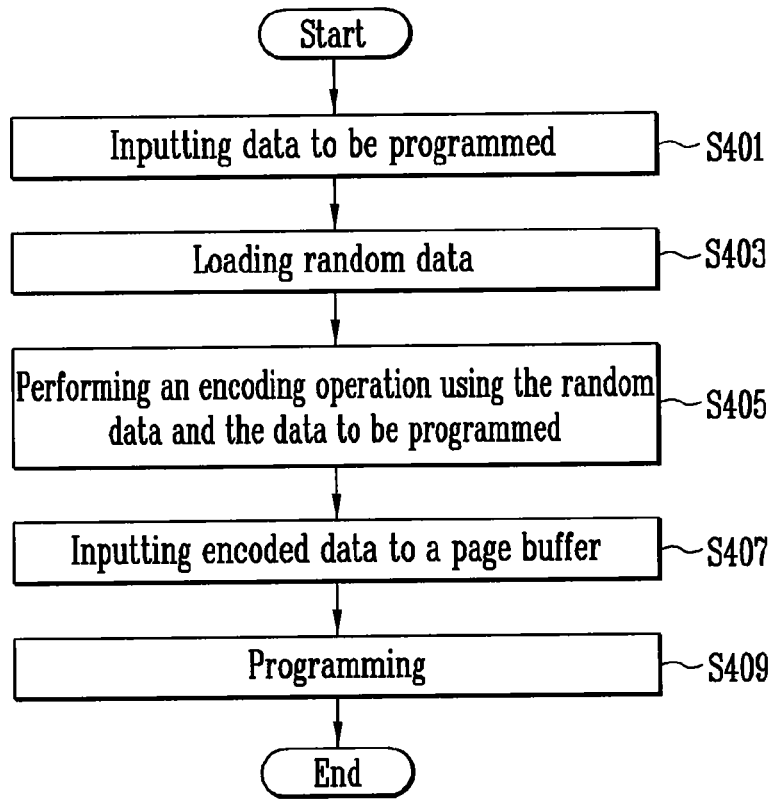
FIG. 4 is a flow chart illustrating a program operation in the flash memory device according to one example embodiment of the present invention.

FIG. 4 is a flow chart illustrating a program operation in the flash memory device according to one embodiment of the present invention. At step S401, data (or input data) to be programmed are inputted with a program command to the data input/output circuit 370 through the IO pad. The data input/output circuit 370 provides the input data to the encoder 384 in the data converting circuit 380.

At step S403, the encoder 384 loads (or receives) random data from the storage circuit 382, in accordance with a control signal of the control circuit 360. The random data received is that assigned to the word line associated with the program operation. The random data are generated by the random data generator 381 in the data converting circuit 380 and are stored in the storage circuit 382 as described in FIG. 3A to FIG. 3C.

At step S405, the encoder 384 generates the data to be programmed (or encoded data) by using the input data and the random data. The generated data (or encoded data) are inputted to a page buffer in the page buffer circuit 320 to be programmed into the memory cells (step S407). The encoded data are generated by performing an XOR operation on the random data and the input data, as described above.

For example, in the case that it is assumed that the input data and the random data are '111001' and '1', respectively, the encoded data to be programmed are '000110'.

At step S409, the encoded data to be programmed are programmed into the memory cells from the page buffer in the page buffer circuit 320.

Figure 5:
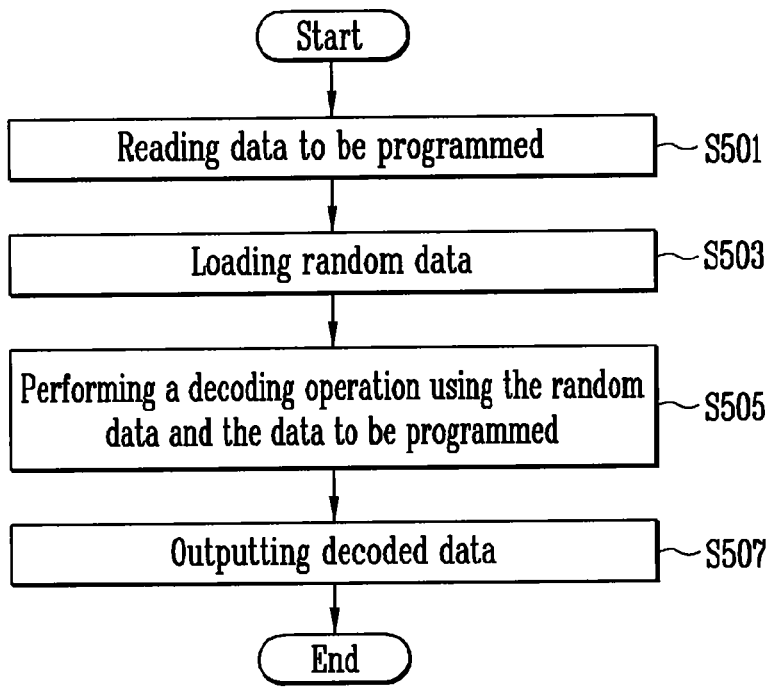
FIG. 5 is a flow chart illustrating a read operation in the flash memory device according to one example embodiment of the present invention.

FIG. 5 is a flow chart illustrating a read operation in the flash memory device according to one embodiment of the present invention. At step S501, the control circuit 360 reads data from selected memory cells (or selected page) in the memory cell array 310 from the page buffer circuit 320 in accordance with a read command. The selected memory cells are read by selecting a corresponding word line. The read data are provided to the decoder 383 through the Y decoder 330.

At step S503, the decoder 383 loads (or receives) the random data corresponding to the word line associated with the read data in accordance with a control signal of the control circuit 360.

At step S505, the decoder 383 generates data to be outputted to the IO pad by using the loaded random data and the read data. The output data (or decoded data) are generated by performing an XOR operation on the loaded random data and the read data, as mentioned above.

Referring back to FIG. 4, the input data received were '111001'. The input data were encoded to '000110' and programmed into the memory cells. If the same memory cells are read according to FIG. 5, the read data would be '000110'. The read data are then decoded using the random data assigned to the selected word line is '1', which is the same as that used by the encoding step. The decoder 383 performs XOR operations on the read data using the random data as one of the inputs. The data generated (or decoded data) are '111001,' the same as the input data received.

At step S507, the data generated (or decoded data) by the decoder 383 are outputted to the IO pad through the data input/output circuit 370.

In brief, the input data are the same as the data outputted from the decoder 383, and the rate of the programmed memory cells in the memory cell array 310 is a maximum 50%. Additionally, the rate of memory cells not programmed in the memory cell array 310 is a maximum 50%. As a result, affects due to BPD may be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A non-volatile memory device comprising:
    a memory cell block having a plurality of memory cells and being associated with a plurality of word lines, each word line being associated with conversion information;
    an encoder configured to encode input data to be programmed using a conversion information of a selected word line, so that the encoded data are programmed into memory cells of the selected word line; and
    a decoder configured to decode data read from the memory cells of the selected word line using the conversion information of the selected word line in response to a read command.

2. The non-volatile memory device of claim 1, further comprising:
    a data converting circuit coupled to a data input/output circuit and a control circuit, wherein the data converting circuit includes the encoder, the decoder, and a storage circuit configured to store the conversion information for each word line associated with the memory block.

3. The non-volatile memory device of claim 2, wherein the data converting circuit further includes a random data generator to generate the conversion information for each word line randomly.

4. The non-volatile memory device of claim 1, wherein the encoder performs XOR operations on the input data using the conversion information of the selected word line to encode the input data to generate the encoded data.

5. The non-volatile memory device of claim 1, wherein the conversion information is generated according a predetermined rule.

6. A non-volatile memory device comprising:
    a memory cell array having a plurality of memory cells, the memory cells are coupled to at least first and second word lines, first word line and second word line being associated with first conversion information and second conversion information, respectively;
    a page buffer circuit having a plurality of page buffers for temporarily storing data to be programmed into the memory cells or data read from the memory cells;
    a data converting circuit configured to encode input data for the first word line during a program operation using the first conversion information associated with the first word line, or decode data read from memory cells associated with the second word line during a read operation using the second conversion information associated with the second word line;
    a Y decoder configured to couple the data converting circuit to the page buffer circuit in accordance with address information; and
    a control circuit configured to control the data converting circuit so that the data converting circuit selects the conversion information in accordance with the address information, so that the data converting circuit can use the conversion information in an encoding or decoding operation.

7. The non-volatile memory device of claim 6, wherein the data converting circuit includes:
    an encoder configured to encode the input data received from a data input/output circuit; and
    a decoder configured to decode the data read from the memory cells.

8. The non-volatile memory device of claim 6, wherein the first conversion information and the second conversion information are randomly generated during an initialization step of the non-volatile memory device.

9. The non-volatile memory device of claim 6, wherein the data converting circuit further includes a storage circuit configured to store the first conversion information and second conversion information in accordance with an address of respective word lines.

10. The non-volatile memory device of claim 6, wherein the data converting circuit further includes a random data generator configured to generate randomly the first conversion information and the second conversion information.

11. The non-volatile memory device of claim 6, wherein the encoder performs an XOR operation on the input data using the first conversion information to generate the encoded data, and the decoder performs an XOR operation on the read data using the second conversion information to generate the decoded data.

12. A non-volatile memory device comprising:
    a memory cell array in which memory cells are coupled to word lines and bit lines;
    a page buffer circuit having a plurality of page buffers for temporarily storing data to be programmed into the memory cells or data read from the memory cells; and
    a Y decoder configured to output encoded data and decoded data, wherein the encoded data are data converted from input data that are input for a program operation using a conversion information of a selected word line, and wherein the decoded data are generated by decoding data read from memory cells of the selected word line using the conversion information of the selected word line, and the decoded data and the input data are the same.

13. A non-volatile memory device comprising:
    a memory cell array in which memory cells are coupled to word lines and bit lines;
    a page buffer circuit having a plurality of page buffers for temporarily storing data to be programmed into the memory cells or data read from the memory cells;

a Y decoder configured to provide input/output data path for the page buffer circuit in accordance with address information; and a data input/output circuit coupled to the Y decoder, and configured to output encoded data and decoded data, wherein the encoded data are data converted from input data that are input for a program operation using a conversion information of a selected word line, and wherein the decoded data are generated by decoding data read from memory cells of the selected word line using the conversion information of the selected word line, and the decoded data and the input data are the same.

14. A method of operating a non-volatile memory device, the method comprising:

generating a plurality of conversion information associated with a corresponding plurality of word lines, the plurality of word lines being associated with a memory cell block having a plurality of memory cells;

generating encoded data to be programmed by encoding input data using a conversion information of a selected word line; and programming the encoded data into memory cells associated with the selected word line.

15. The method of claim 14, wherein the encoded data to be programmed are generated by performing an XOR operation on the input data of the selected word line using the conversion information of the selected word line.

16. The method of claim 14, wherein the plurality conversion information is generated after the memory cell block has been erased.

17. The method of claim 14, further comprising:

reading data stored in the memory cells of the selected word line; and decoding the read data using the conversion information of the selected word line; and outputting the decoded data to an input/output pad.

18. The method of claim 17, wherein the encoding step includes an XOR operation performed on the input data using the conversion information of the selected word line.

19. The method of claim 18, wherein the decoding step includes an XOR operation performed on the read data using the conversion information of the selected word line.

* * * * *